United States Patent
Shiragami

(10) Patent No.: US 12,459,860 B2
(45) Date of Patent: Nov. 4, 2025

(54) METHOD FOR MANUFACTURING JOINED BODY AND DEVICE FOR MANUFACTURING JOINED BODY

(71) Applicant: Nippon Electric Glass Co., Ltd., Shiga (JP)

(72) Inventor: Toru Shiragami, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 74 days.

(21) Appl. No.: 18/288,680

(22) PCT Filed: May 17, 2022

(86) PCT No.: PCT/JP2022/020576
§ 371 (c)(1),
(2) Date: Oct. 27, 2023

(87) PCT Pub. No.: WO2023/276478
PCT Pub. Date: Jan. 5, 2023

(65) Prior Publication Data
US 2024/0217872 A1 Jul. 4, 2024

(30) Foreign Application Priority Data
Jun. 29, 2021 (JP) .................................. 2021-107851

(51) Int. Cl.
C03C 27/04 (2006.01)
C03C 27/10 (2006.01)
(52) U.S. Cl.
CPC ............ *C03C 27/048* (2013.01); *C03C 27/10* (2013.01)

(58) Field of Classification Search
CPC ....... C03C 27/048; C03C 27/06; C03C 27/10; H01L 23/02
(Continued)

(56) References Cited

U.S. PATENT DOCUMENTS 4,952,258 A 8/1990 Grolig et al.
2018/0134023 A1 5/2018 Lu
(Continued)

FOREIGN PATENT DOCUMENTS

JP 2-248349 10/1990
JP 2000-302489 10/2000
(Continued)

OTHER PUBLICATIONS

International Preliminary Report on Patentability and Written Opinion of the International Searching Authority issued Dec. 14, 2023 in International (PCT) Application No. PCT/JP2022/020576 with English-language translation.
(Continued)

*Primary Examiner* — James D Sells
(74) *Attorney, Agent, or Firm* — Wenderoth, Lind & Ponack, L.L.P.

(57) ABSTRACT

In a method for producing a bonded body, a bonding step includes a supporting step of mounting a laminate on a support device, and a pressing step of pressing the laminate. The support device includes a pressing member configured to press the laminate, a base member supporting the pressing member, a supporting member configured to support the laminate, and a fixing mechanism configured to fix the supporting member to the base member. In the supporting step, the fixing mechanism fixes the supporting member to the base member.

12 Claims, 17 Drawing Sheets

(58) Field of Classification Search
USPC .................................................... 156/272.8
See application file for complete search history.

(56) References Cited

U.S. PATENT DOCUMENTS

| | | | |
|---|---|---|---|
| 2021/0358879 A1* | 11/2021 | Sugakawa | ............... H01L 24/83 |
| 2022/0314594 A1 | 10/2022 | Shiragami et al. | |
| 2023/0265012 A1 | 8/2023 | Shiragami et al. | |

FOREIGN PATENT DOCUMENTS

| | | |
|---|---|---|
| JP | 2001-121228 | 5/2001 |
| JP | 2013-203056 | 10/2013 |
| JP | 2018-199600 | 12/2018 |
| JP | 2021-31306 | 3/2021 |
| JP | 2021-62983 | 4/2021 |

OTHER PUBLICATIONS

International Search Report (ISR) issued Aug. 2, 2022 in International (PCT) Application No. PCT/JP2022/020576.
Notice of Reasons for Refusal issued Feb. 3, 2025 in corresponding Japanese Patent Application No. 2021-107851, with English language translation.
Decision of Refusal issued Jun. 19, 2025 in corresponding Japanese Patent Application No. 2021-107851, with English-language Translation.

\* cited by examiner

METHOD FOR MANUFACTURING JOINED BODY AND DEVICE FOR MANUFACTURING JOINED BODY

TECHNICAL FIELD

The present invention relates to a method and a device for producing a bonded body by bonding substrates.

BACKGROUND ART

As is well known, electronic elements such as LED elements are housed in hermetically sealed packages to prevent deterioration. A hermetically sealed package is constructed as a bonded body by bonding, for example, a first substrate, which is a base material, and a second substrate made of a glass substrate.

For example, Patent Document 1 discloses a method for producing a bonded body by interposing a sealing material (bonding material) between a first substrate which is a base material (bonding target member) and a second substrate made of a glass member, and heating the sealing material.

This producing method includes preparing a laminate in which the sealing material is disposed between the first substrate and the second substrate, mounting the laminate on a jig, and adjusting the atmospheric pressure inside the jig to press the laminate. While the laminate is pressed, the sealing material is irradiated with a laser beam to form a bonded portion from the sealing material, thereby producing a bonded body (see paragraphs 0036 to 0046 of Patent Document 1).

The jig used in this producing method includes a jig body for supporting the laminate and a lid for the jig body for pressing the laminate.

The jig body further includes a biasing portion that biases the laminate disposed in a recessed portion of the jig body toward the lid for the jig body. The biasing portion includes a biasing body resisting a compression force and a biasing plate disposed between the biasing body and the laminate.

The biasing body includes a plurality of plungers and a base in which the plurality of plungers are mounted. The biasing plate is supported by the plungers of the biasing body, and can more uniformly transmit the biasing force of the biasing body to the laminate. The laminate is placed on the biasing plate when housed in the recessed portion of the jig body.

CITATION LIST

Patent Literature

Patent Document 1: JP 2021-31306 A

SUMMARY OF INVENTION

Technical Problem

In the known method for producing the bonded body as described above, the biasing plate of the biasing portion is supported in a state of being in contact with the plungers of the biasing body, which easily causes positional misalignment when the laminate is placed. As the position of the biasing plate changes, the position of the laminate mounted on the biasing plate also changes, requiring adjustment of the irradiation position of the laser beam to the laminate. This could complicate the process.

The present invention has been made in view of the above circumstances, and it is a technical object of the present invention to prevent the positional misalignment of the supporting member supporting the bonded body.

Solution to Problem

The present invention has been made to solve the above problem, and there is provided a method for producing a bonded body including a first substrate, a second substrate, and a sealing layer bonding the first substrate and the second substrate, the method including laminating to form a laminate by overlapping the first substrate and the second substrate while interposing a sealing material between the first substrate and the second substrate; and bonding to form the sealing layer by irradiating the sealing material of the laminate with a laser beam, in which the bonding includes supporting to mount the laminate on a support device, pressing the laminate, and performing laser irradiation to irradiate the sealing material with the laser beam, the support device includes a pressing member configured to press the laminate, a base member supporting the pressing member, a supporting member configured to support the laminate, and a fixing mechanism configured to fix the supporting member to the base member, and the supporting includes fixing the supporting member to the base member by the fixing mechanism.

According to this configuration, fixing the supporting member to the base member by the fixing mechanism can reliably prevent the positional misalignment of the supporting member during the supporting.

The fixing mechanism may include a fixing member including a head and a shaft, and a hole formed in the support member and through which the shaft is insertable. Thus, the support member can be suitably fixed to the base member.

The fixing mechanism may include a fixing member including a head and a shaft, a hole formed in the supporting member and through which the head and the shaft are insertable, a recessed portion formed in the supporting member and configured to lock the head, and a guide groove formed in the support member and through which the shaft is relatively moved between the hole and the recessed portion.

According to this configuration, attachment, and removal of the supporting member to and from the base member can be facilitated.

The shaft of the fixing member may include a male screw portion, and the base member may include a screw hole engaging the male screw portion. According to this configuration, changing the position of the shaft of the fixing member engaged with the screw hole of the base member can adjust the position of the supporting member.

The base member may include an elastic member supporting the support member, and during the supporting, the fixing member may fix the supporting member to the base member with the elastic member being elastically deformed. This makes it possible to bias the supporting member by an elastic restoring force of the elastic member when pressing the laminate.

The supporting member may include a housing portion configured to house the laminate. Housing the laminate in the housing portion can prevent positional misalignment of the laminate relative to the supporting member.

The present invention has been made to solve the above problem, and there is provided a device for producing a bonded body, the bonded body including a first substrate, a second substrate, and a sealing layer bonding the first substrate and the second substrate, the device including a support device configured to support a laminate formed by overlapping the first substrate and the second substrate while interposing a sealing material between the first substrate and the second substrate: and a laser irradiation device configured to irradiate the sealing material of the laminate with a laser beam to form the sealing layer, in which the support device includes a pressing member configured to press the laminate, a base member supporting the pressing member, a supporting member configured to support the laminate, and a fixing mechanism configured to fix the supporting member to the base member, and the supporting member is fixed to the base member by the fixing mechanism.

According to this configuration, fixing the supporting member to the base member by the fixing mechanism can reliably prevent the positional misalignment when the laminate is supported on the support member.

Advantageous Effects of Invention

According to the present invention, the positional misalignment of the supporting member that supports the bonded body can be prevented.

DESCRIPTION OF EMBODIMENTS

Hereinafter, embodiments for implementing the present invention will be described with reference to the drawings.

FIGS. 1 to 17 illustrate a first embodiment of a producing method and a producing device for producing a bonded body according to the present invention.

Figure 1:
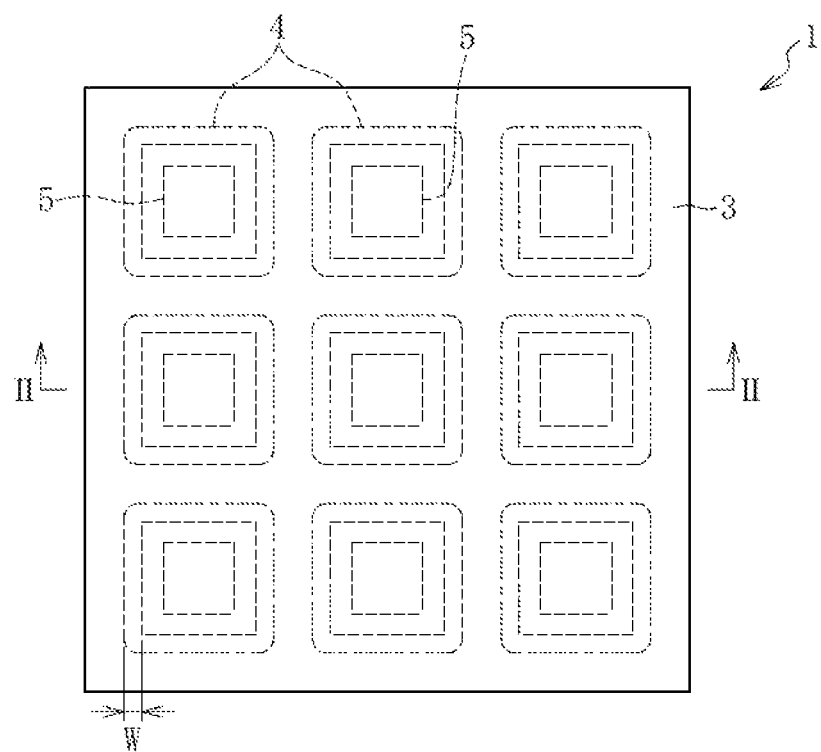
FIG. 1 is a plan view of a bonded body.
Figure 2:
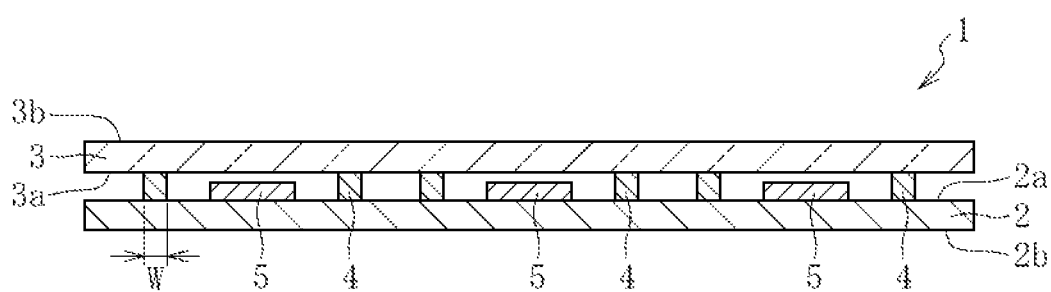
FIG. 2 is a cross-sectional view taken along line II-II in FIG. 1.

FIGS. 1 and 2 illustrate a hermetically sealed package as an example of a bonded body produced according to the present invention. A bonded body 1 includes a first substrate 2 as a base material, a second substrate 3 that is overlaid on the first substrate 2, a plurality of sealing layers 4 bonding the first substrate 2 and the second substrate 3, and elements 5 that are housed inside the sealing layer 4 between the first substrate 2 and the second substrate 3.

The first substrate 2 is formed in, for example, a rectangular shape, but is not limited to this shape. The first substrate 2 includes a first main surface 2a on which the elements 5 are mounted, and a second main surface 2b located on the opposite side of the first main surface 2a. The first main surface 2a may include recessed portions capable of housing the elements 5.

The first substrate 2 is constituted by a highly thermally conductive substrate such as a silicon substrate, but is not limited thereto, and may be any of various types of substrates such as other metal substrates, ceramic substrates, and semiconductor substrates. Note that the thickness of the first substrate 2 is within a range from 0.1 mm to 5.0 mm, but is not limited to this range.

The thermal conductivity of the first substrate 2 may be higher than the thermal conductivity of the second substrate 3. The thermal conductivity of the first substrate 2 at 20° C. is preferably from 10 W/m·K to 500 W/m·K, more preferably from 30 W/m·K to 300 W/m·K, still more preferably from 70 W/m·K to 250 W/m·K, particularly preferably from 100 W/m·K to 200 W/m·K, but is not limited to this range.

The second substrate 3 is constituted by, for example, a transparent glass substrate with a rectangular shape, but is not limited to this shape. The second substrate 3 includes a first main surface 3a and a second main surface 3b located on the opposite side of the first main surface 3a.

Examples of the glass configuring the material of the second substrate 3 include alkali-free glass, borosilicate glass, soda-lime glass, quartz glass, and crystallized glass having a low coefficient of thermal expansion. The thickness of the second substrate 3 is not particularly limited and is, for example, within a range from 0.01 mm to 2.0 mm. The thermal conductivity of the second substrate 3 at 20° C.; is preferably from 0.5 W/m·K to 5 W/m·K, but is not limited to this range.

The plurality of sealing layers 4 are formed in the bonded body 1 in a predetermined array pattern. The sealing layers 4 are formed by interposing the plurality of sealing materials between the first substrate 2 and the second substrate 3, irradiating the sealing materials with a laser beam to heat the sealing materials, thereby softening and fluidizing the sealing materials.

Figure 3:
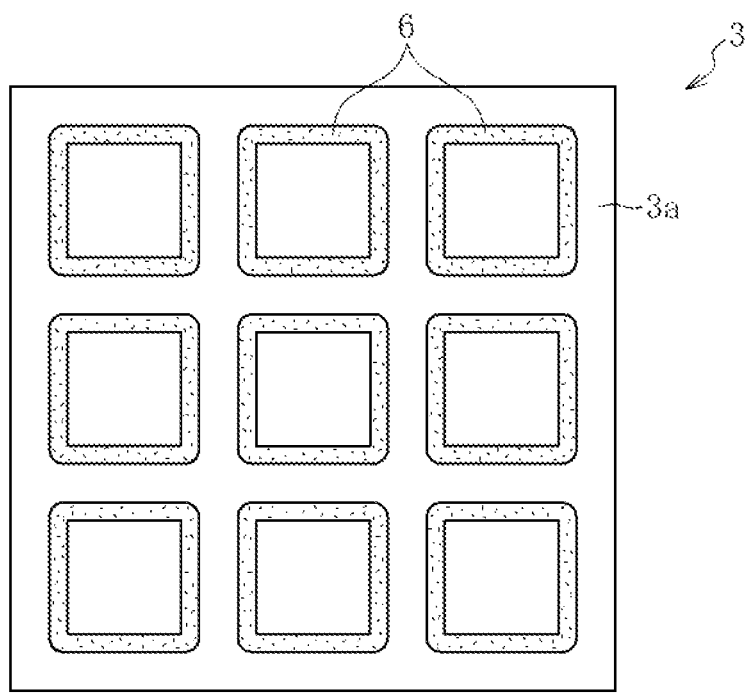
FIG. 3 is a bottom view of a second substrate.

FIG. 3 illustrates a bottom view of the second substrate 3 before being bonded to the first substrate 2. When the sealing material is interposed between the first substrate 2 and the second substrate 3, a sealing material 6 may be fixed to the first main surface 3a of the second substrate 3 in advance. Alternatively, the sealing material may be fixed to the first substrate 2 in advance, or a sheet-like sealing material may be interposed between the first substrate 2 and the second substrate 3.

Various materials can be used as the sealing material. From the perspective of increasing sealing strength, a composite material containing bismuth-based glass powder and refractory filler powder (glass frit) is preferably used. In addition to the bismuth-based glass powder, glass powders of silver phosphate-based glass, tellurium-based glass, or the like can also be used as the sealing material.

Various materials can be used as the refractory filler powder. One or more materials selected from cordierite, zircon, tin oxide, niobium oxide, zirconium phosphate-based ceramic, willemite, β-encryptite, and β-quartz solid solution are preferably used.

As illustrated in FIG. 1, the sealing layer 4 is arranged in a closed curve shape forming a space for housing the elements 5 by bonding. In the present invention, the term "closed curve" means not only shapes composed only of curved lines but also shapes composed of a combination of curved lines and straight lines, and shapes composed only of straight lines (e.g., polygonal shapes such as quadrangular shapes).

The thickness of the sealing layer 4 is preferably from 1 μm to 20 μm, more preferably from 3 μm to 8 μm. A width dimension W of the sealing layer 4 is preferably from 50 μm to 2000 μm, more preferably from 100 am to 1000 μm.

The elements 5 are mounted on the first main surface 2a of the first substrate 2. The element 5 is disposed in a space (cavity) defined by the first main surface 2a of the first substrate 2, the first main surface 3a of the second substrate 3, and the sealing layer 4. As the element 5, various types of elements such as a light-emitting element such as a deep-ultraviolet light-emitting diode (LED), a micro electro mechanical systems (MEMS) element, and a charge coupled device (CCD) element can be used.

Figure 4:
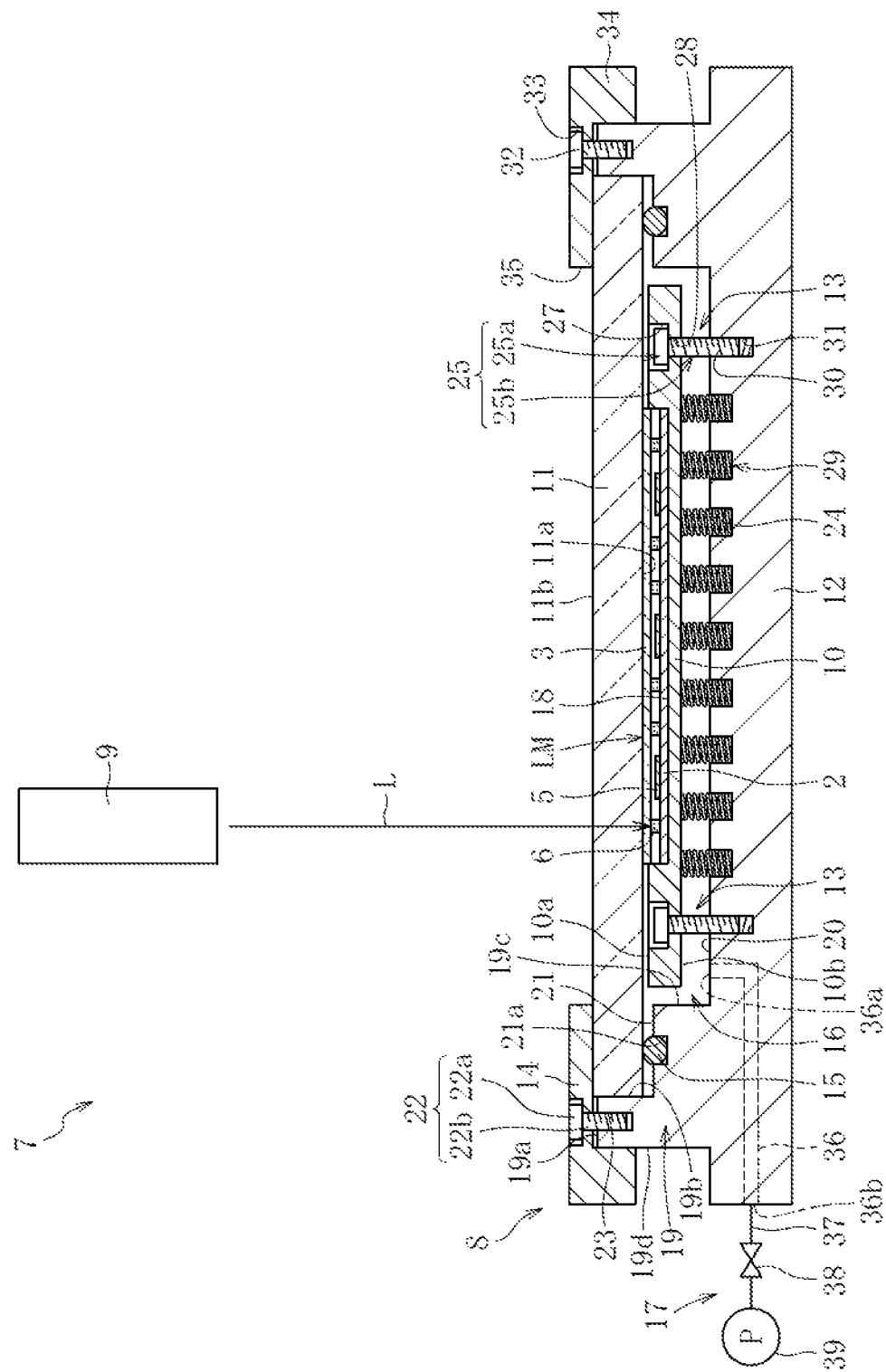
FIG. 4 is a cross-sectional view illustrating a device for producing the bonded body.

FIGS. 4 to 12 illustrate a producing device 7 for producing the bonded body 1. As illustrated in FIG. 4, the producing device 7 includes a support device 8 configured to support a laminate LM formed by laminating the first substrate 2 and the second substrate 3 to each other via the sealing material 6, and a laser irradiation device 9 configured to irradiate the sealing material 6 of the laminate LM with a laser beam L to form the sealing layer 4.

As illustrated in FIGS. 4 to 9, the support device 8 includes a supporting member 10 configured to support the laminate LM, a pressing member 11 configured to press the laminate LM, a base member 12 supporting the pressing member 11, a fixing mechanism 13 that fixes the supporting member 10 to the base member 12, a frame body 14 that fixes the pressing member 11 to the base member 12, a sealing member 15 disposed between the pressing member 11 and the base member 12, a housing space 16 for the laminate LM formed between the pressing member 11 and the base member 12, and an atmospheric pressure adjusting device 17 configured to adjust the atmospheric pressure in the housing space 16.

The supporting member 10 is disposed in the housing space 16 together with the laminate LM. The supporting member 10 is constituted by a circular plate member made of, for example, a metal (such as stainless steel) (see FIG. 7). The material and shape of the supporting member 10 are not limited to those of the present embodiment. The supporting member 10 includes a first surface 10a and a second surface 10b located on the opposite side of the first surface 10a. The first surface 10a includes a housing portion 18 configured to house the laminate LM. In the present embodiment, the housing portion 18 is constituted by a recessed portion configured to house the laminate LM, but there is no limitation on the configuration of the housing portion 18 as long as the housing portion 18 is in a form capable of positioning the laminate LM. For example, a plurality of positioning protrusions may be provided on the first surface 10a of the supporting member 10, and the space inside the protrusions may be used as the housing portion 18.

Figure 8:
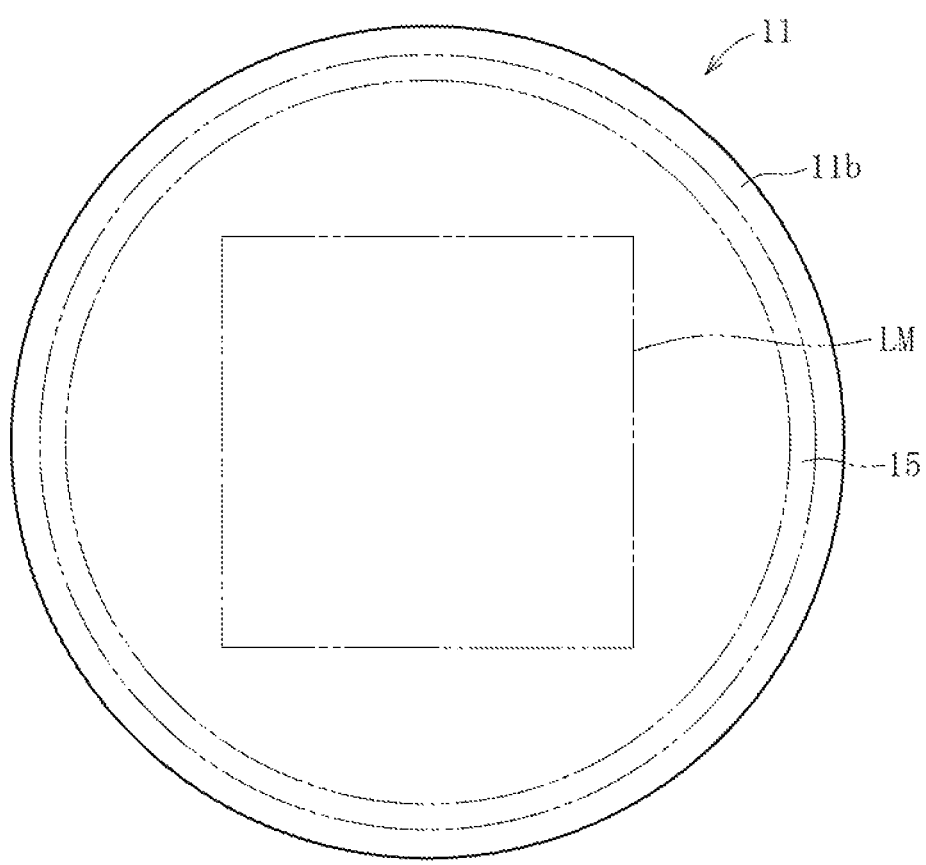
FIG. 8 is a plan view of a pressing member.

As illustrated in FIG. 8, the pressing member 11 is a transparent glass plate formed in, for example, a circular shape. The thickness of the pressing member 11 is preferably from 3 mm to 10 mm, for example. The Young's modulus of the pressing member 11 is preferably from 50 GPa to 80 GPa, more preferably from 60 GPa to 70 GPa. The pressing member 11 includes a first surface 11a that comes into contact with the sealing member 15 and the laminate LM, and a second surface 11b that comes into contact with the frame body 14.

The base member 12 is made of a metal (e.g., stainless steel), but may be made of other materials. The base member 12 includes a wall portion 19 and a bottom portion 20 to form the housing space 16.

Figure 5:
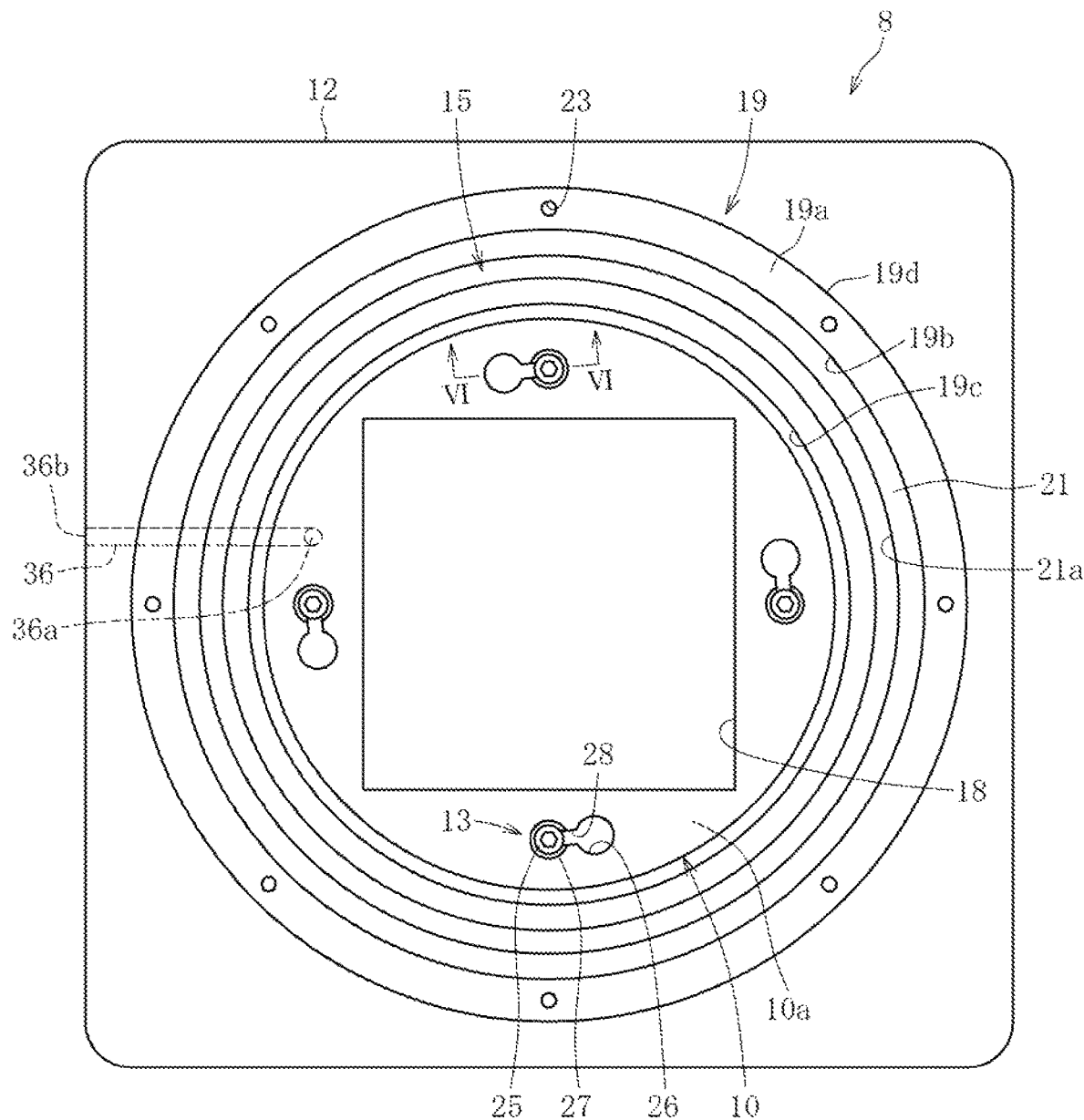
FIG. 5 is a plan view illustrating a portion of a support device.

FIG. 5 is a plan view of the base member 12 to which the supporting member 10 is fixed by the fixing mechanism 13. The wall portion 19 of the base member 12 is formed in a tubular shape, but is not limited to this shape. A support seat 21 to which the sealing member 15 is attached is formed in the middle of the inner side of the wall portion 19. The support seat 21 is a surface facing the pressing member 11 attached to the base member 12. The support seat 21 includes a groove 21a having an annular shape in plan view to which the sealing member 15 is attached.

As illustrated in FIGS. 4 and 5, the wall portion 19 includes an end surface 19a (upper surface), inner peripheral surfaces 19b, 19c, and an outer peripheral surface 19d.

The frame body 14 is fixed to the end surface 19a of the wall portion 19 via a fixing member 22. The fixing member 22 is constituted by, for example, a bolt or a screw member, and includes a head 22a and a shaft 22b. A plurality of screw holes 23 for engaging the shafts 22b of the fixing members 22 are formed in the end surface 19a.

The inner peripheral surfaces 19b, 19c of the wall portion 19 include a first inner peripheral surface 19b that functions as a guide surface to guide the pressing member 11 to the support seat 21, and a second inner peripheral surface 19e into which the supporting member 10 can be inserted. The diameter of the first inner peripheral surface 19b is larger than the diameter of the pressing member 11. The diameter of the second inner peripheral surface 19e is larger than the diameter of the supporting member 10.

A bottom portion 20 of the base member 12 is formed inside the wall portion 19 having a tubular shape. The bottom portion 20 is constituted by a surface having a circular shape in plan view.

Figure 6:
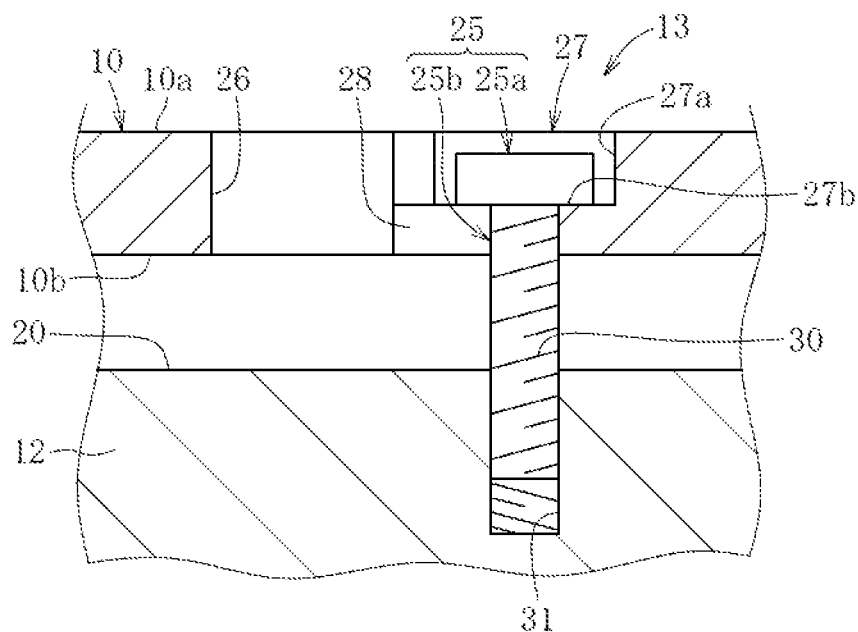
FIG. 6 is a cross-sectional view taken along line VI-VI in FIG. 5.

As illustrated in FIGS. 4 to 6, the fixing mechanism 13 includes elastic members 24 that supports the supporting member 10, fixing members 25 that fix the supporting member 10 to the base member 12, insertion holes 26 each formed in the supporting member 10 and into which a part of the fixing member 25 can be inserted, locking recesses 27 that are formed in the supporting member 10 and that each lock a portion of the fixing member 25, and guide grooves 28 each formed in the supporting member 10 and through which the fixing member 25 is relatively moved between the insertion hole 26 and the locking recess 27.

The elastic members 24 are attached to the bottom portion 20 of the base member 12. A plurality of elastic members 24 are disposed at the bottom portion 20. The elastic members 24 are constituted by, for example, compression coil springs, but are not limited thereto, and may be constituted by other springs, rubbers, or any other materials. The bottom portion 20 includes a plurality of attaching recesses 29 each housing a portion of the elastic member 24. One end portions of the elastic members 24 are inserted into the attaching recesses 29, and the other end portions thereof protrude from the bottom portion 20. The elastic members 24 function to bias the supporting member 10 by its elastic restoring force.

The fixing member 25 is constituted by, for example, a bolt or a screw member and includes a head 25a and a shaft 25b. The head 25a has a dimension (diameter) larger than the diameter of the shaft 25b. The shaft 25b has a male screw portion 30. The shaft 25b is fixed to the bottom portion 20 of the base member 12. A screw hole 31 into which the shaft 25b is fitted is formed in the bottom portion 20 of the base member 12.

Figure 7:
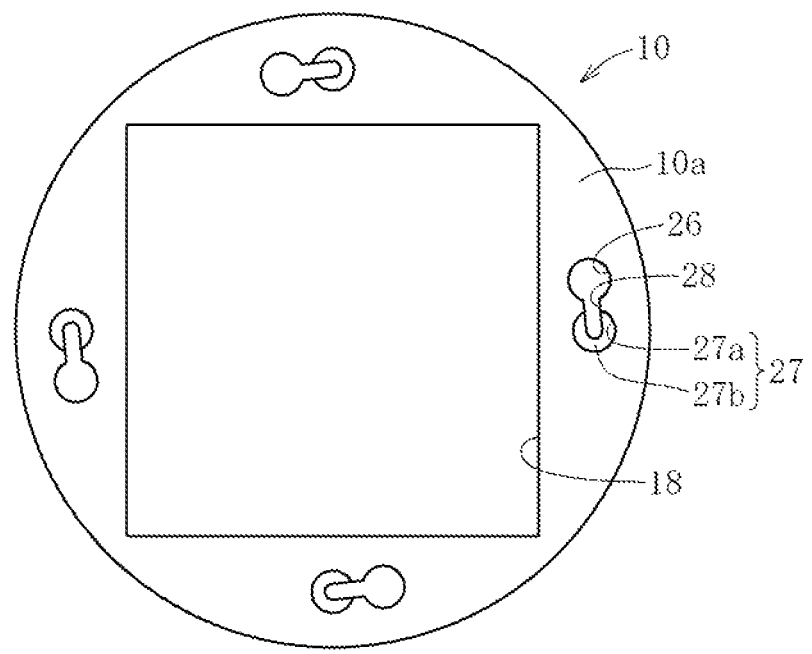
FIG. 7 is a plan view of a supporting member.

As illustrated in FIG. 7, the insertion holes 26 are formed in a circular shape in plan view, but is not limited to this shape. The diameter of each insertion hole 26 is larger than the dimension (diameter) of the head 25a to allow insertion of the head 25a and the shaft 25b of the fixing member 25 therethrough.

The locking recess 27 includes a side wall surface 27a into which the head 25a of the fixing member 25 can be inserted, and a bottom surface 27b for locking the head 25a. The side wall surface 27a is formed in a circular shape in plan view, but is not limited to this shape. The side wall surface 27a has a larger diameter than the dimension of the head 25a so as not to come into contact with the head 25a of the fixing member 25. The bottom surface 27b is configured to come into contact with the head 25a.

The guide groove 28 extends through the supporting member 10 in the thickness direction thereof to allow insertion of the shaft 25b of the fixing member 25 therethrough. The guide groove 28 is connected to the insertion hole 26 of the fixing member 25 and the bottom surface 27b of the locking recess 27 to relatively move the shaft 25b of the fixing member 25 between the insertion hole 26 and the locking recess 27. Specifically, one end portion of the guide groove 28 communicates with the inner peripheral surface of the insertion hole 26. The other end portion of the guide groove 28 is located at the center of the bottom surface 27b of the locking recess 27.

The guide groove 28 is formed in an arc shape or a linear shape in plan view. When the supporting member 10 is rotated around the center thereof, the guide groove 28 allows the shaft 25b of the fixing member 25 to relatively move between the insertion hole 26 and the locking recess 27.

Figure 9:
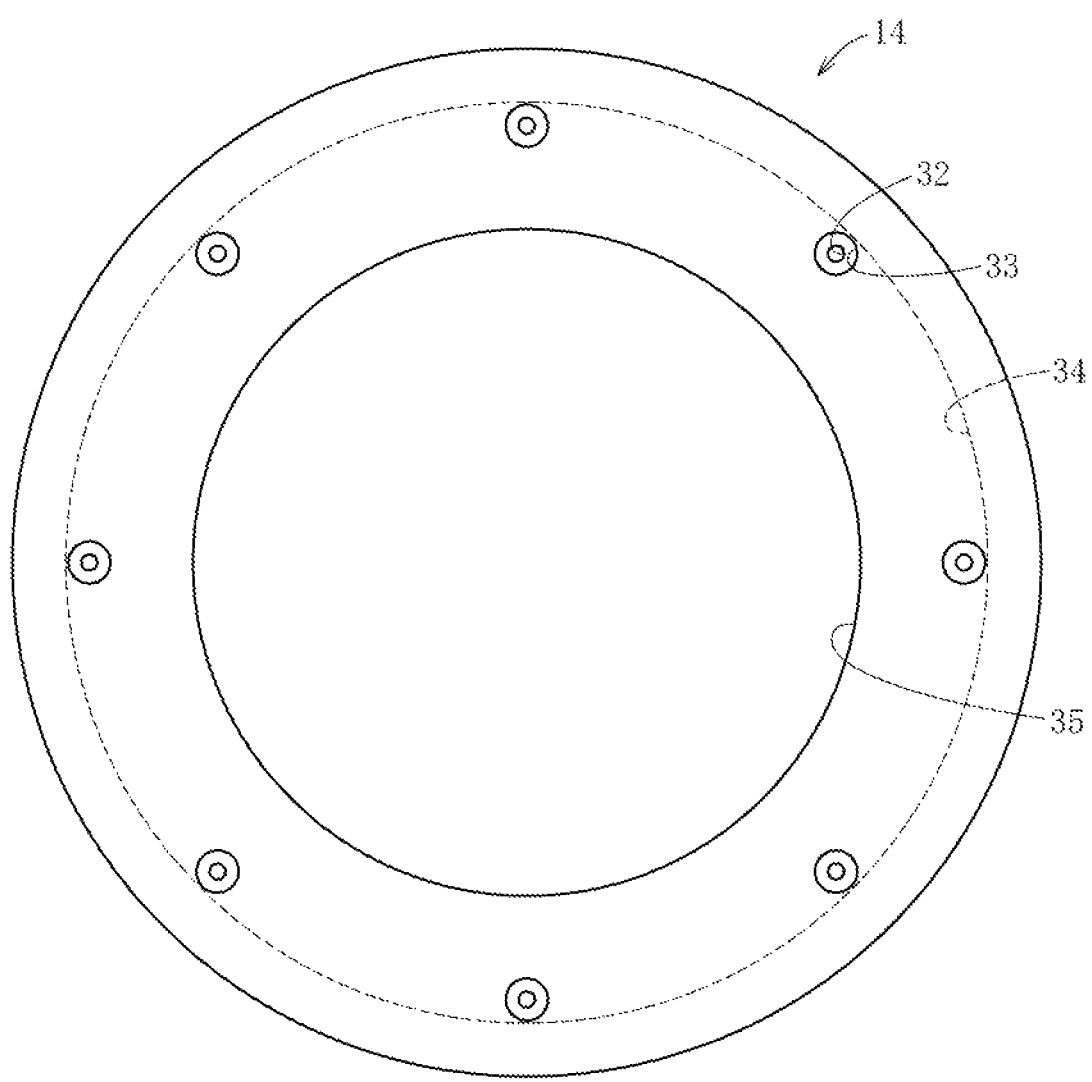
FIG. 9 is a plan view of a frame body.

As illustrated in FIG. 9, the frame body 14 is a plate-like member formed in an annular shape in plan view. The frame body 14 is fixed to the end surface 19a of the wall portion 19 of the base member 12 with the fixing member 22. The frame body 14 includes insertion holes 32 each of which allows insertion of the shaft 22b of the fixing member 22 therethrough, locking recesses 33 each housing the head 22a of the fixing member 22, a tubular portion 34, and an opening 35.

As illustrated in FIGS. 4 and 9, the insertion hole 32 and the locking recess 33 are formed concentrically in plan view. A plurality of insertion holes 32 and locking recesses 33 are formed in the frame body 14. The tubular portion 34 is formed in a tubular shape corresponding to the shape of the wall portion 19 of the base member 12. The diameter of the inner peripheral surface of the tubular portion 34 is larger than the diameter of the outer peripheral surface 19d of the wall portion 19 of the base member 12. The opening 35 is formed in a circular shape in plan view. The diameter of the opening 35 is smaller than the diameter of the pressing member 11.

The sealing member 15 is constituted by an elastic member such as a rubber member (e.g., an O-ring). As illustrated in FIGS. 4 and 5, the sealing member 15 is disposed in the annular groove 21a formed in the support seat 21 of the base member 12. The sealing member 15 adheres to the pressing member 11 to seal the housing space 16.

As illustrated in FIG. 8, the sealing member 15 is configured to circularly surround the laminate LM between the pressing member 11 and the base member 12. The diameter of the circular sealing member 15 is smaller than the diameter of the pressing member 11 and larger than the diameter of the supporting member 10.

The housing space 16 of the laminate LM is a space formed by the pressing member 11, the base member 12, and the sealing member 15. The housing space 16 is made hermetic by adhering the pressing member 11 to the sealing member 15 attached to the support seat 21 of the base member 12. The laminate LM, the supporting member 10, and the fixing mechanism 13 can be housed in the housing space 16.

As illustrated in FIG. 4, the atmospheric pressure adjusting device 17 mainly includes a flow path 36 formed at the base member 12 and through which the gas in the housing space 16 flows out, a pipe 37 connected to the flow path 36, an adjustment valve 38 provided in the middle of the pipe 37, and a pump 39. The flow path 36 includes a suction port 36a formed in the bottom portion 20 of the base member 12, and an exhaust port 36b formed in the outer surface of the base member 12. The atmospheric pressure adjusting device 17 suctions air in the housing space 16 with the pump 39 to reduce the air pressure in the housing space 16, thus generating a negative pressure in the housing space 16 with respect to the atmosphere.

As the laser irradiation device 9, one that emits a semiconductor laser is preferably used, but no such limitation is intended. Other devices that emit various types of lasers such as a YAG laser, a green laser, and an ultrashort pulse laser may also be used.

Figure 10:
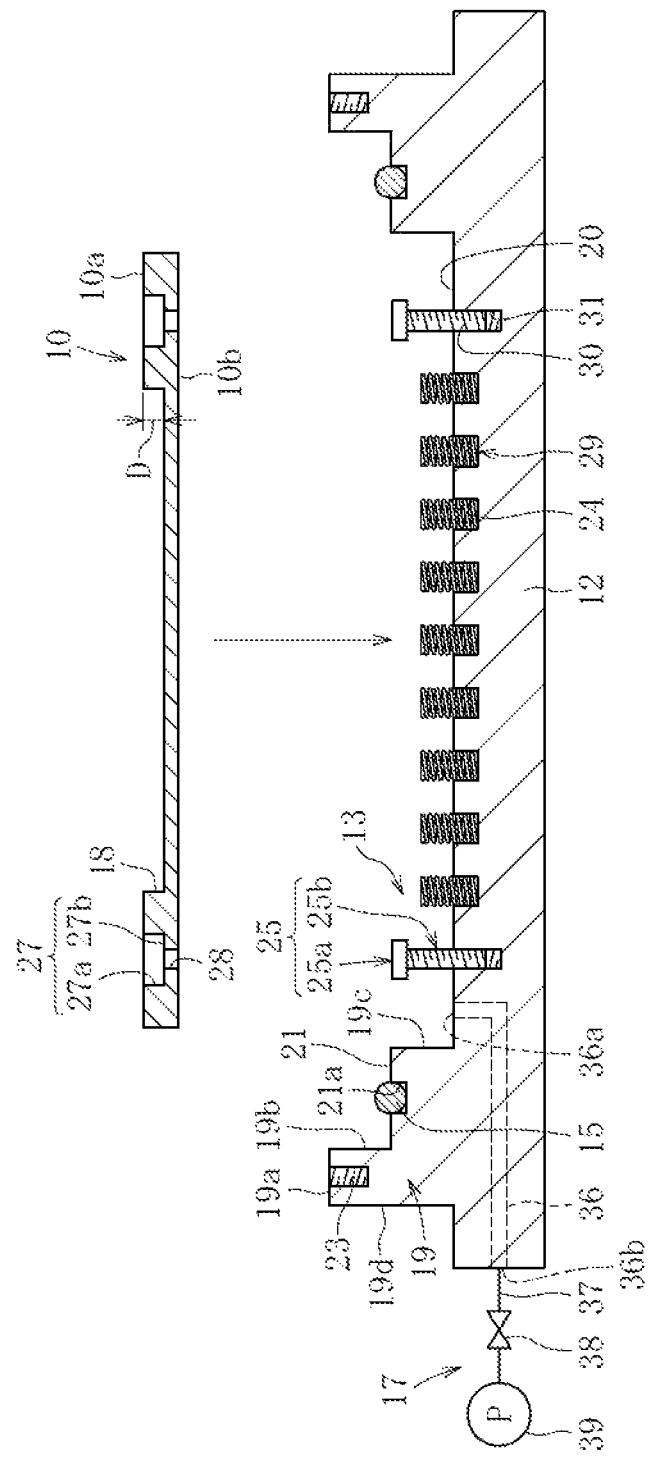
FIG. 10 is a cross-sectional view illustrating a method for attaching the supporting member to a base member.
Figure 11:
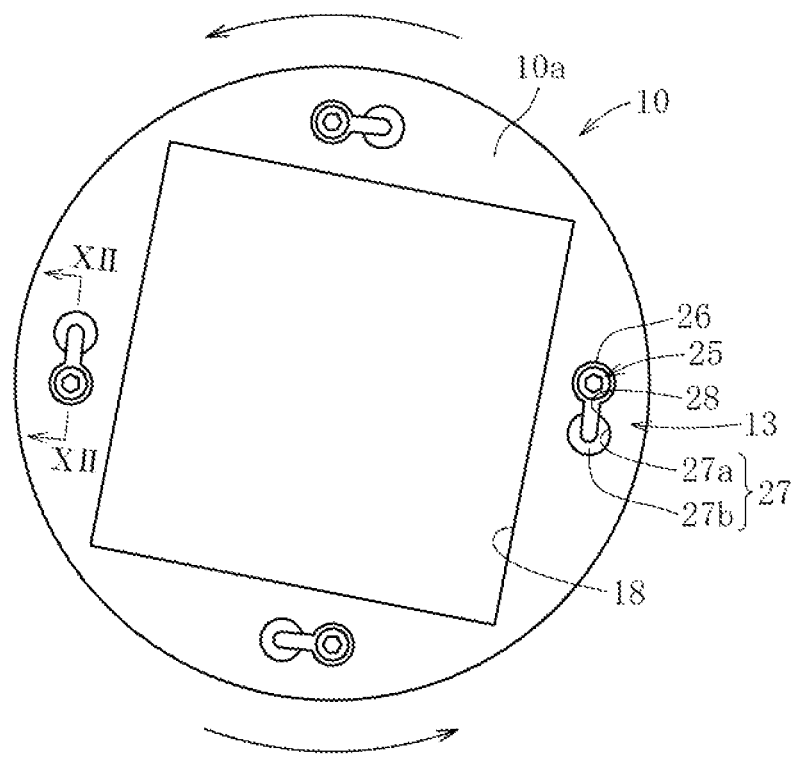
FIG. 11 is a plan view illustrating the method for attaching the supporting member to the base member.
Figure 12:
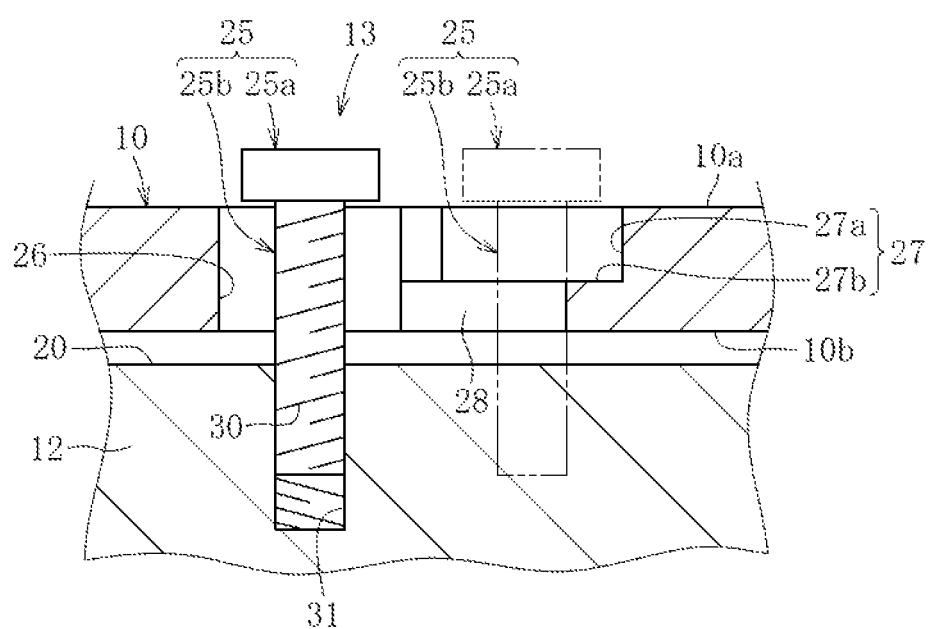
FIG. 12 is a cross-sectional view taken along line XII-XII in FIG. 11.

Hereinafter, a method of fixing the supporting member 10 to the base member 12 by the fixing mechanism 13 will be described. First, as illustrated in FIG. 10, in a state in which the shaft 25b of each fixing member 25 is attached to the screw hole 31 of the base member 12, the supporting member 10 is brought close to the base member 12 from above. As the supporting member 10 is lowered, the head 25a and the shaft 25b of the fixing member 25 are inserted into the insertion hole 26, as illustrated in FIGS. 11 and 12. At this time, the upper end portions of the elastic members 24 attached to the base member 12 come into contact with the second surface 10b of the supporting member 10.

Subsequently, the supporting member 10 is pressed against the elastic members 24 so that the head 25a of each fixing member 25 protrudes from the first surface 10a of the supporting member 10, as illustrated in FIG. 12. The elastic members 24 contract while being elastically deformed. This causes the elastic members 24 to generate an elastic restoring force to resist the force pressing down on the supporting member 10.

Subsequently, while keeping the heads 25a in the protruding state, the supporting member 10 is rotated counterclockwise in plan view as indicated by the arrows in FIG. 11. Accordingly, each shaft 25b inserted into the insertion hole 26 relatively moves toward the locking recess 27 through the guide groove 28. As indicated by a two-dotted line in FIG. 12, the bead 25a of the fixing member 25 relatively moves toward the locking recess 27 via the guide groove 28 to be positioned above the locking recess 27.

Subsequently, when the force pressing the supporting member 10 against the elastic members 24 is released, the supporting member 10 is pushed up by the biasing force of the elastic members 24. This allows the head 25a of the fixing member 25 to enter the locking recess 27. The locking recess 27 is locked to the fixing member 25 by the bottom surface 27b coming into contact with the head 25a. In this state, it is desirable that the elastic members 24 do not return to the free length and continue to bias the supporting member 10 by the elastic restoring force.

The force with which the elastic members 24 bias the supporting member 10 can be adjusted by rotating the fixing members 25 around the axial center to axially change the positions of the heads 25a. Preferably, to enable this positional adjustment, the end portion of the shaft 25b of the fixing member 25 is not positioned at the bottom portion of the screw hole 31 formed in the base member 12, but is positioned in the middle of the screw hole 31.

To remove the supporting member 10 from the base member 12, the supporting member 10 is pressed against the elastic members 24 to cause contraction of the elastic member 24, while the supporting member 10 is moved downward to cause the head 25a of the fixing member 25 to come out from the locking recess 27. The supporting member 10 is then rotated clockwise in plan view. This causes the shaft 25b of the fixing member 25 to engage the guide groove 28. By the relative movement between the supporting member 10 and the fixing member 25, the shaft 25b is disposed in the insertion hole 26.

Subsequently, the supporting member 10 is lifted so that each head 25a of the fixing member 25 passes through the insertion hole 26 from the first surface 10a side toward the second surface 10b side. Thus, the supporting member 10 is removed from the base member 12.

As described above, the fixing mechanism 13 can facilitate attachment and removal of the supporting member 10 to and from the base member 12. In addition, by adjusting the position of each fixing member 25 with respect to the screw hole 31, the fixing position of the supporting member 10 can be adjusted according to the thickness of the laminate LM.

Figure 13:
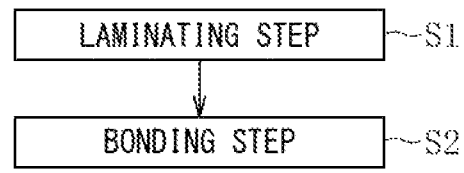
FIG. 13 is a flowchart illustrating a method for producing the bonded body.

Hereinafter, a method for producing the bonded body 1 using the producing device 7 having the configuration described above will be described below with reference to FIGS. 13 to 17. As illustrated in FIG. 13, the present method includes a laminating step S1 and a bonding step S2.

Figure 14:
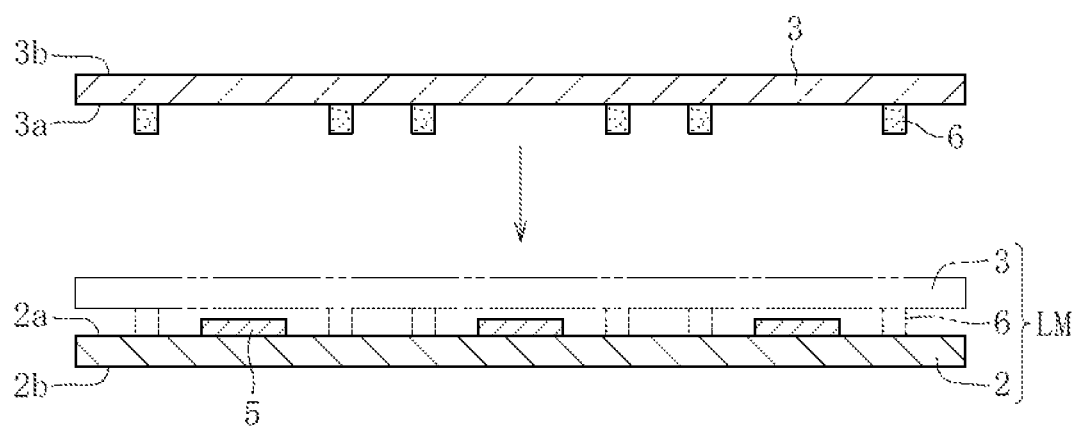
FIG. 14 is a cross-sectional view illustrating a laminating step.

As illustrated in FIG. 14, in the laminating step S1, the first substrate 2 and the second substrate 3 are overlapped with the first main surface 2a of the first substrate 2 and the first main surface 3a of the second substrate 3 facing each other. Note that the elements 5 are already disposed on the first main surface 2a of the first substrate 2. The first substrate 2 and the second substrate 3 are layered to each other with the elements 5 located inside the sealing material 6, thereby forming the laminate LM.

Figure 15:
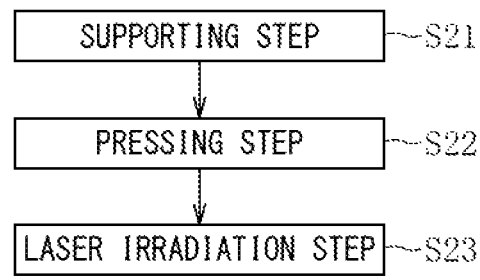
FIG. 15 is a flowchart illustrating a bonding step.

As illustrated in FIG. 15, the bonding step S2 includes a supporting step S21, a pressing step S22, and a laser irradiation step S23.

Figure 16:
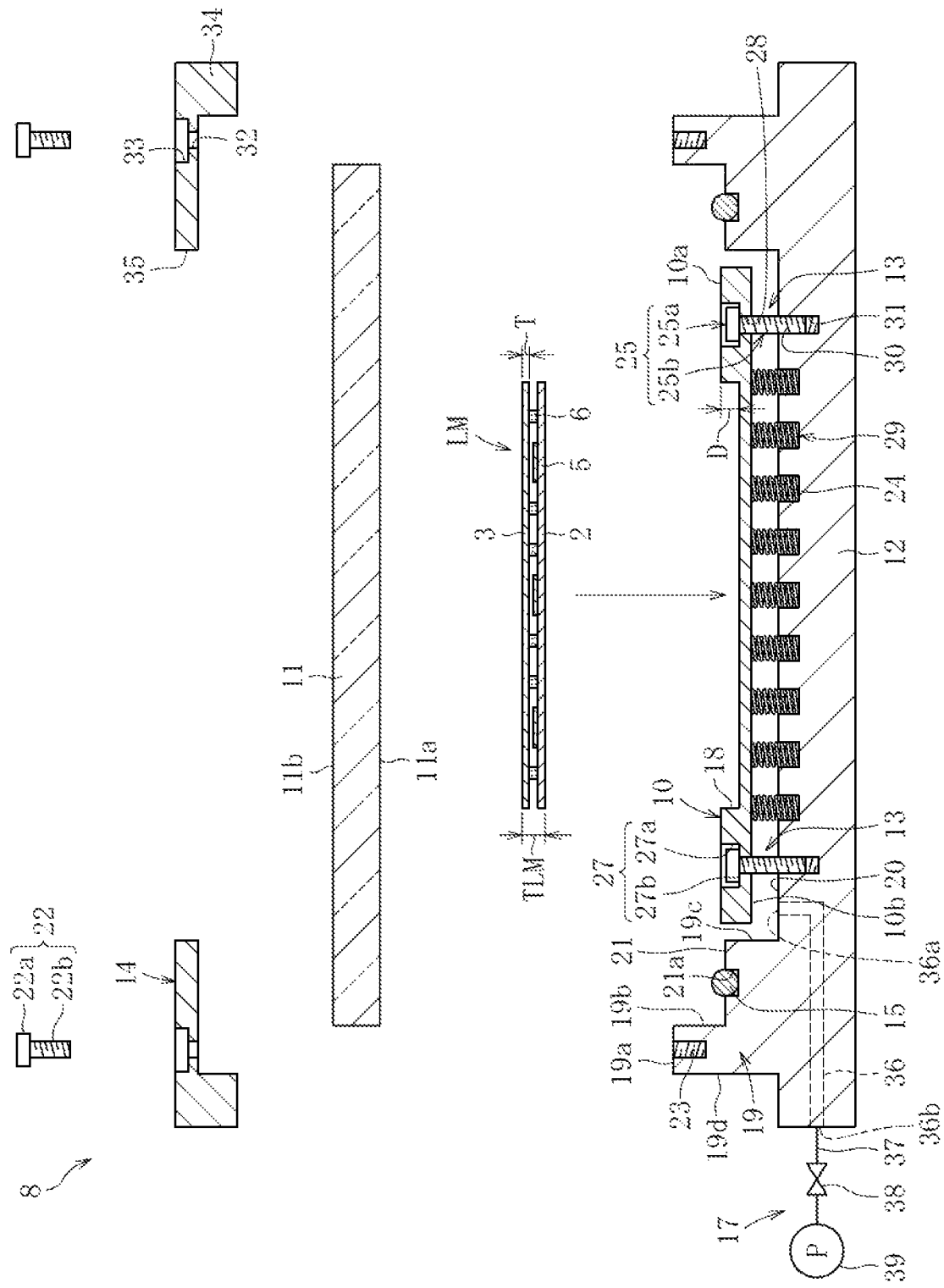
FIG. 16 is a cross-sectional view illustrating a supporting step.

In the supporting step S21, the laminate LM formed in the laminating step S1 is mounted on the support device 8. That is, as illustrated in FIG. 16, the laminate LM is housed in the housing portion 18 of the supporting member 10, the supporting member 10 being attached to the base member 12 by the fixing mechanism 13.

Figure 17:
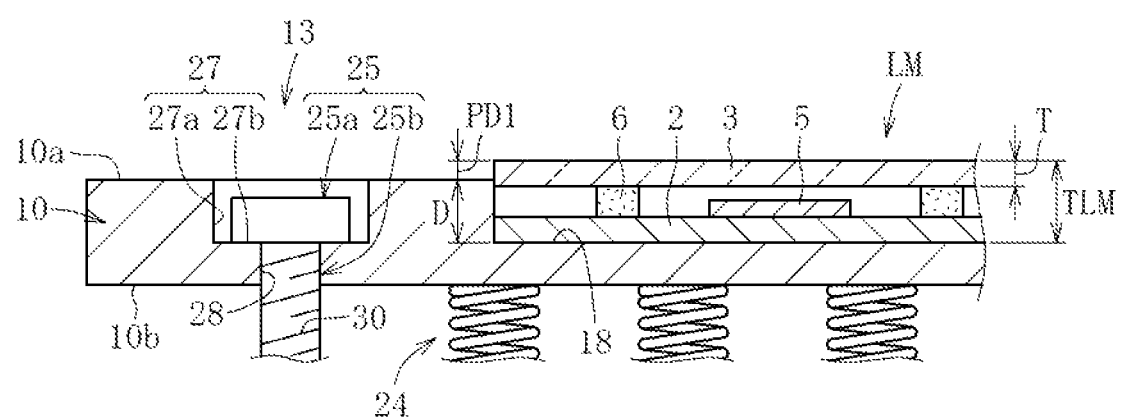
FIG. 17 is a cross-sectional view illustrating the supporting step.

As illustrated in FIG. 17, a thickness dimension TLM of the laminate LM is preferably larger than a depth dimension D of the housing portion 18. The laminate LM is housed in the housing portion 18 with a portion of the second substrate 3 in the thickness direction protruding from the housing portion 18 toward the pressing member 11. A dimension PD1 by which a portion of the second substrate 3 in the thickness direction protrudes from the recessed portion is preferably from 0.05 to 0.95 times the thickness dimension T of the second substrate 3 (0.05 T≤PD1≤0.95 T).

Subsequently, the pressing member 11 is placed on the sealing member 15 attached to the support seat 21 of the base member 12. Accordingly, the first surface 11a of the pressing member 11 comes into contact with the sealing member 15. At this time, the pressing member 11, the sealing member 15, and the laminate LM are preferably arranged concentrically. In this state, the first surface 11a of the pressing member 11 may be in contact with the second main surface 3b of the second substrate 3 of the laminate LM.

Subsequently, the frame body 14 is mounted on the end surface 19a of the wall portion 19 of the base member 12, and the frame body 14 is fixed to the wall portion 19 with the fixing members 22. That is, the insertion holes 32 of the frame body 14 are aligned with the screw holes 23 of the wall portion 19 of the base member 12, and each shaft 22b of the fixing member 22 is inserted into the insertion hole 32 and engaged with the screw hole 23 to fasten the fixing member 22. In this state, the frame body 14 and the sealing member 15 sandwich and hold the pressing member 11. A portion of the second surface 11b of the pressing member 11 is exposed through the opening 35 of the frame body 14 toward the laser irradiation device 9. Thus, the mounting of the laminate LM on the support device 8 is completed. Accordingly, the laminate LM and the supporting member 10 are housed in the housing space 16.

In the supporting step S21, the housing space 16 may be filled with, for example, dry air. This allows the cavities formed in the produced laminate LM to be kept at low moisture and degradation in performance of the elements 5 in the hermetically sealed package to be avoided. Here, dry air refers to a gas from which moisture has been removed by a drying treatment, that is, a gas that does not generate water even when the pressure changes. The dry air that can be used is, for example, dried air from the environment in which the producing device 7 is located, and a high-purity nitrogen gas.

Preferably, for example, the support device 8 is disposed in a workspace filled with dry air, and the supporting step S21 is performed in the workspace to fill the housing space 16 with the dry air. Accordingly, not only the housing space 16 but also the space (housing space of the elements 5) inside the sealing material 6 between the first substrate 2 and the second substrate 3 of the laminate LM is filled with the dry air.

In the subsequent pressing step S22, the gas in the housing space 16 is sucked by the pump 39 through the flow path 36 of the atmospheric pressure adjusting device 17 and discharged to the outside. This decreases the atmospheric pressure in the housing space 16, generating a negative pressure with respect to the atmosphere. By the action of the negative pressure, the first surface 11a of the pressing member 11 adheres to the sealing member 15 and presses the second substrate 3 of the laminate LM. In the pressing step S22, the pressure in the housing space 16 can be adjusted by operating the adjustment valve 38. The atmospheric pressure in the housing space 16 is preferably from 100 Pa to 95,000 Pa, more preferably from 1,000 Pa to 85,000 Pa.

In the pressing step S22, the pressing member 11 is preferably deflected, by the action of the negative pressure in the housing space 16, to press the laminate LM.

As illustrated in FIG. 4, in the laser irradiation step S23, the sealing material 6 of the laminate LM is irradiated with a laser beam L from the laser irradiation device 9 to heat the sealing material 6 (heating step). The laser beam L passes through the pressing member 11 and the second substrate 3 to irradiate the sealing material 6. In the bonding step S2, the sealing material 6 is heated at a temperature equal to or higher than a temperature of the softening point of the sealing material 6, or at a temperature at which the sealing material 6 softens and is fluidized, by irradiation of the laser beam L. When the laser beam L is irradiated, the laser beam L goes around and along the closed curve of the sealing materials 6.

The wavelength of the laser beam L is preferably from 600 nm to 1600 nm. A semiconductor laser is suitably used as the laser, but the laser is not limited thereto. Various types of lasers such as a YAG laser, a green laser, and an ultrashort pulse laser may be used.

Heated by the laser beam L, the sealing material 6 softens and is fluidized, and then solidifies. As a result, the sealing layer 4 hermetically bonding the first substrate 2 and the second substrate 3 is formed. In this way, the bonded body 1 including the first substrate 2, the second substrate 3, and the sealing layer 4 is produced. The bonded body 1 is removed from the supporting member 10 after the frame body 14 and the pressing member 11 are removed from the base member 12.

According to the producing method and the producing device 7 of the bonded body 1 according to the present embodiment described above, by fixing the supporting member 10 to the base member 12 by the fixing mechanism 13, the positional misalignment of the supporting member 10 can be reliably prevented when the laminate LM is housed in the housing portion 18 of the supporting member 10 in the supporting step S21.

FIGS. 18 to 22 illustrate a second embodiment of the present invention. The present embodiment differs from the first embodiment in the configuration of the laminate LM and the configuration of the support device 8 of the producing device 7.

Figure 18:
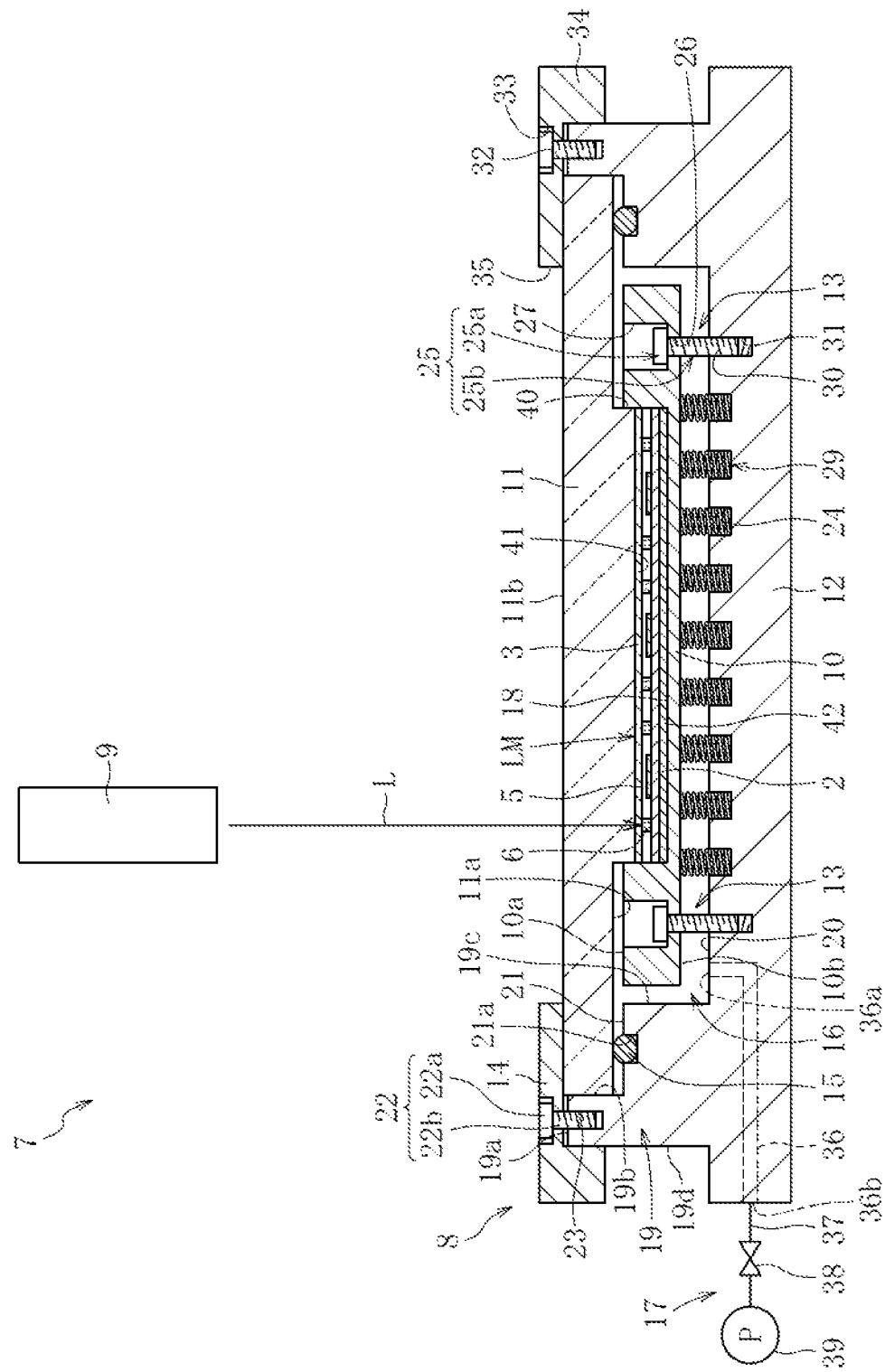
FIG. 18 is a plan view illustrating a device for producing a bonded body according to a second embodiment.

As illustrated in FIG. 18, the pressing member 11 of the support device 8 includes a protruding portion 40 to be inserted into the housing portion 18 of the supporting member 10. The protruding portion 40 is formed on the first surface 11a of the pressing member 11. The protruding portion 40 is formed in a cylindrical shape, but is not limited to this shape. A protruding dimension PD2 of the protruding portion 40 is smaller than the depth dimension D of the housing portion 18 (see FIG. 21). The protruding portion 40 includes a pressing surface 41 that comes into surface contact with the second main surface 3b of the second substrate 3 of the laminate LM.

Figure 19:
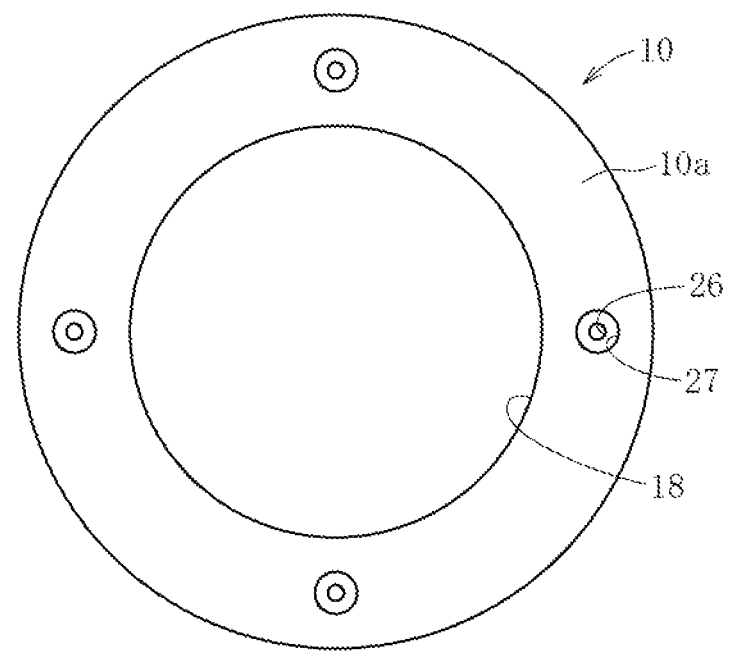
FIG. 19 is a plan view of the supporting member.

As illustrated in FIG. 19, the supporting member 10 of the support device 8 includes a housing portion 18 having a circular shape in plan view. The laminate LM is formed in a circular shape in plan view to engage the housing portion 18 (not illustrated). That is, the first substrate 2 and the second substrate 3 of the laminate LM are formed in a disk shape.

As illustrated in FIGS. 18 to 22, the fixing mechanism 13 includes the insertion holes 26 and the locking recesses 27 formed in the supporting member 10, as well as the elastic members 24 and the fixing members 25 which are the same as those of the first embodiment. Note that the supporting member 10 according to the present embodiment does not include the guide grooves 28 of the first embodiment.

The diameter of each insertion hole 26 is larger than that of the shaft 25b of the fixing member 25 and smaller than the diameter of the head 25a. Therefore, the insertion hole 26 allows insertion of the shaft 25b of the fixing member 25 therethrough, but does not allow the head 25a to pass through.

Similar to the first embodiment, the locking recess 27 includes the side wall surface 27a having a circular shape in plan view and the bottom surface 27b that locks the head 25a of the fixing member 25. The locking recess 27 is formed concentrically with the insertion hole 26 in plan view.

Figure 20:
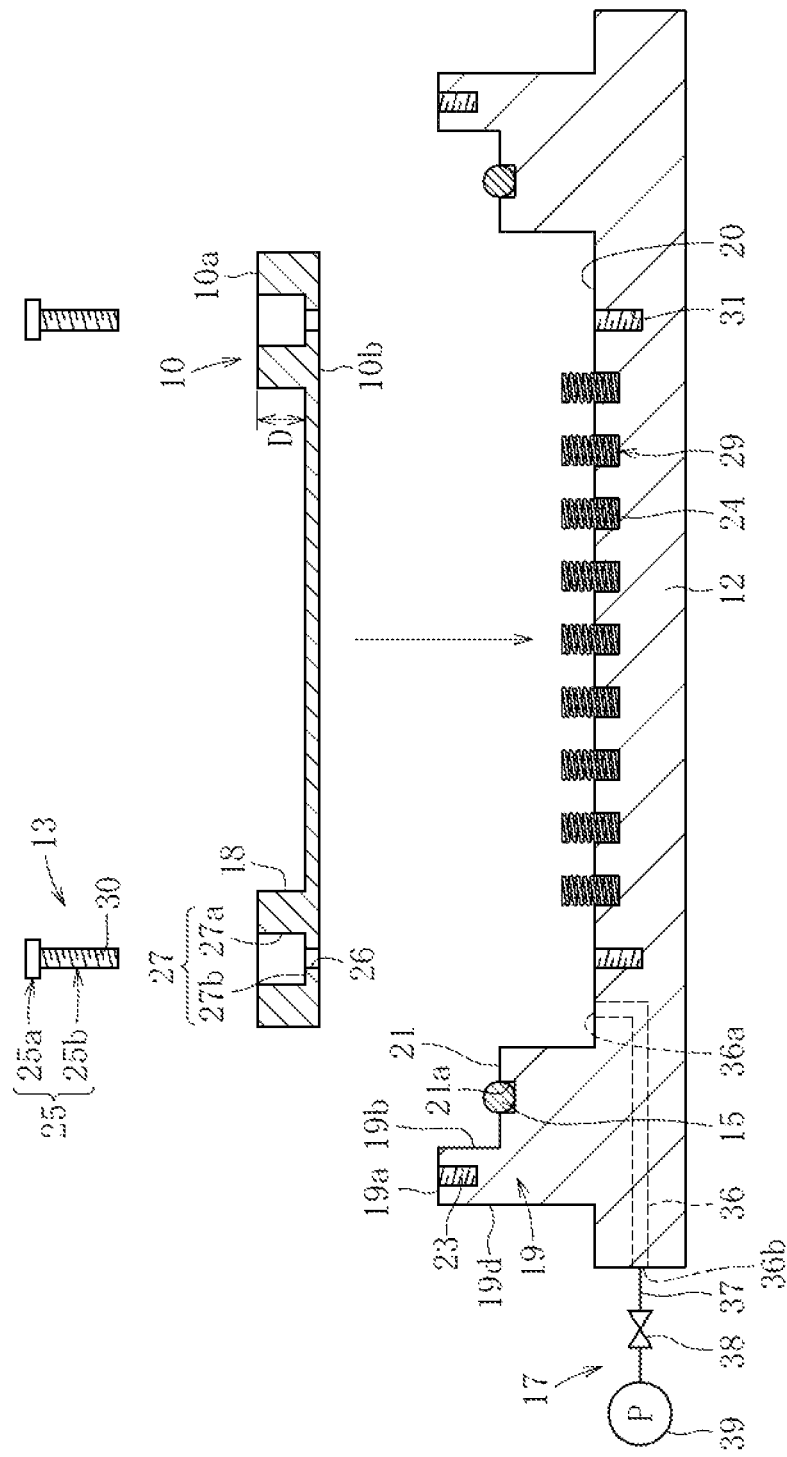
FIG. 20 is a cross-sectional view illustrating a method for attaching the supporting member to the base member.

The supporting member 10 according to the present embodiment is attached to the base member 12 as follows. First, as illustrated in FIG. 20, in a state in which the fixing member 25 of the fixing mechanism 13 is removed from the screw hole 31 of the base member 12, the supporting member 10 is placed on the elastic members 24 attached to the base member 12.

Subsequently, the insertion holes 26 of the supporting member 10 are aligned with the screw holes 31 of the base member 12 in plan view, and the shaft 25b of each fixing member 25 is inserted into the insertion hole 26. The shaft 25b is then engaged with the screw hole 31. This allows the head 25a of the fixing member 25 to come into contact with the bottom surface 27b of the locking recess 27, engaging the supporting member 10. As described above, the supporting member 10 is fixed to the base member 12 by the fixing mechanism 13.

Figure 21:
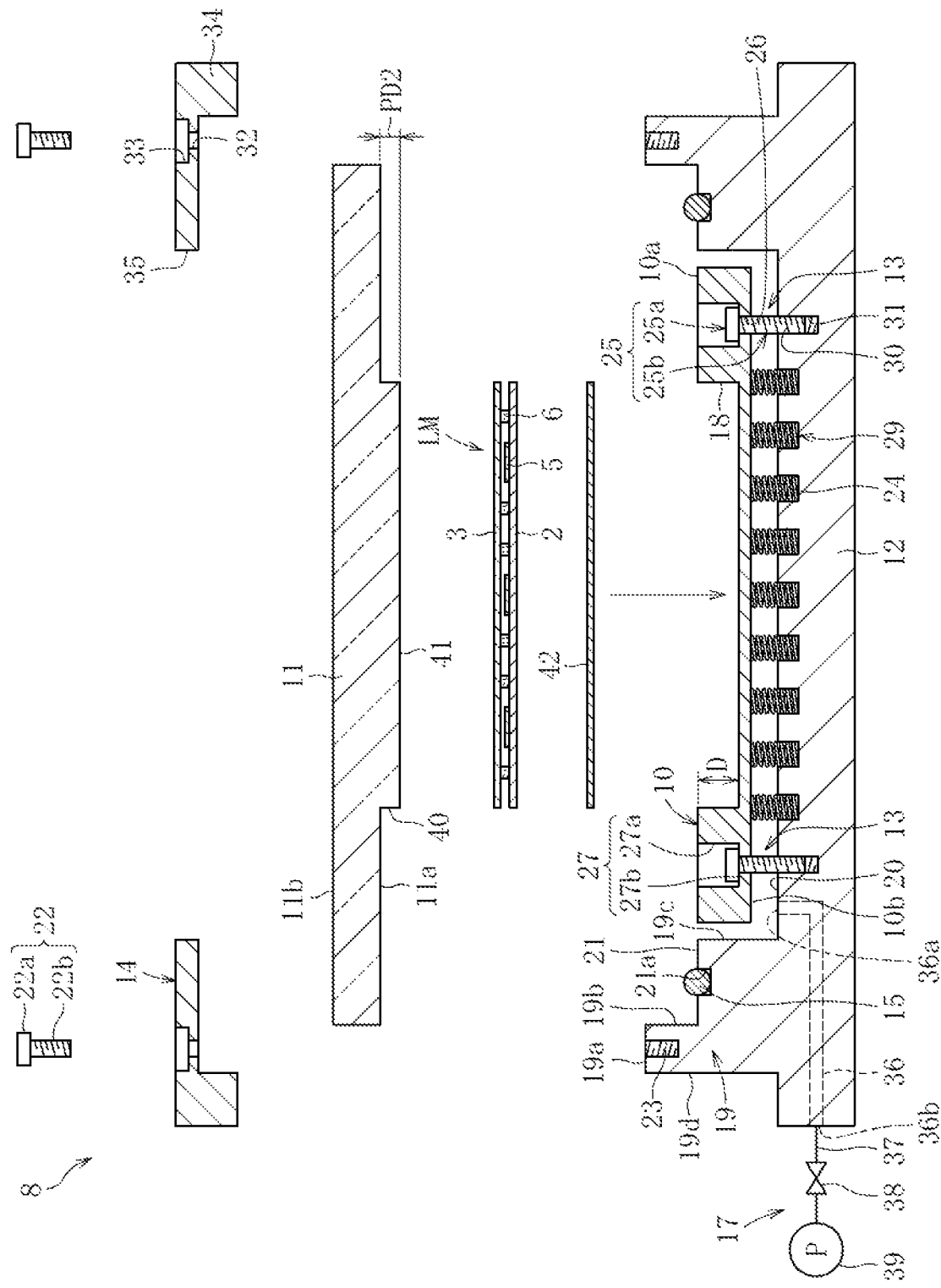
FIG. 21 is a cross-sectional view illustrating a supporting step.
Figure 22:
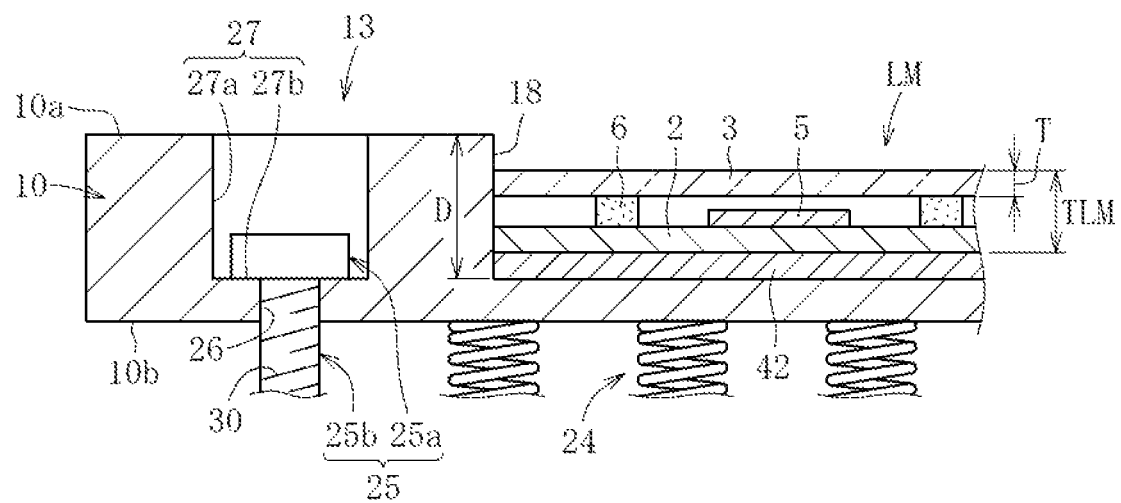
FIG. 22 is a cross-sectional view illustrating the supporting step.

As illustrated in FIGS. 18, 21, and 22, the support device 8 includes an adjustment plate 42 that engages with the housing portion 18. Although one adjustment plate 42 is illustrated in the present embodiment, a plurality of adjustment plates 42 may be used. The adjustment plate 42 is constituted by, for example, a circular glass plate or metal plate. The adjustment plate 42 is placed on the bottom portion of the housing portion 18 to adjust the depth of the housing portion 18. Other than this mode of use, the adjustment plate 42 may be a transparent glass plate, and the adjustment plate 42 may be overlaid on the second main surface 3b of the second substrate 3 of the laminate LM housed in the housing portion 18.

The fixing mechanism 13 and the adjustment plate 42 according to the present embodiment may be used in the support device 8 of the first embodiment.

Hereinafter, ways in which the method for producing the bonded body according to the present embodiment is different from the first embodiment will be described. In the method for producing the bonded body according to the present embodiment, in the supporting step S21, the adjustment plate 42 is housed in the housing portion 18 of the supporting member 10, and then the laminate LM is housed in the housing portion 18, as illustrated in FIG. 21.

As illustrated in FIG. 22, the depth dimension D of the housing portion 18 according to the present embodiment is larger than the thickness dimension TLM of the laminate LM. This prevents the laminate LM from protruding from the housing portion 18 at a portion of the second substrate 3, and is entirely housed in the housing portion 18.

Subsequently, the pressing member 11 is placed on the sealing member 15 attached to the base member 12. At this time, the protruding portion 40 of the pressing member 11 is inserted into the housing portion 18 of the supporting member 10. The pressing surface 41 of the protruding portion 40 comes into contact with the second main surface 3b of the second substrate 3 in the laminate LM housed in the housing portion 18.

In the pressing step S22, the pressing surface 41 presses the second substrate 3 of the laminate LM. In the subsequent laser irradiation step S23, the laser beam L passes through the protruding portion 40 of the pressing member 11 and the second substrate 3 of the laminate LM to irradiate the sealing material 6.

The other configurations of the present embodiment are the same as those of the first embodiment. In the present embodiment, the constituent components similar to or the same as those of the first embodiment are denoted by the common reference signs.

Note that the present invention is not limited to the configurations of the embodiments described above, and is not limited to the actions and effects described above. Various modifications can be made to the present invention without departing from the spirit of the present invention.

REFERENCE SIGNS LIST

1 Bonded body
2 First substrate
3 Second substrate
4 Sealing layer
6 Sealing material
8 Support device
10 Supporting member
11 Pressing member
12 Base member
13 Fixing mechanism
18 Housing portion
24 Elastic member
25 Fixing member of fixing mechanism
26 Insertion hole
27 Locking recess
28 Guide groove
30 Male screw portion
31 Screw hole
L Laser beam
LM Laminate
S1 Laminating step
S2 Bonding step
S21 Supporting step
S22 Pressing step
S23 Laser irradiation step

The invention claimed is:

1. A method for producing a bonded body including a first substrate, a second substrate, and a sealing layer bonding the first substrate and the second substrate, the method comprising:
   laminating to form a laminate by overlapping the first substrate and the second substrate while interposing a sealing material between the first substrate and the second substrate; and
   bonding to form the sealing layer by irradiating the sealing material in the laminate with a laser beam,
   wherein the bonding includes supporting to mount the laminate on a support device, pressing the laminate, and performing laser irradiation to irradiate the sealing material with the laser beam,
   wherein the support device includes
      a pressing member configured to press the laminate,
      a base member supporting the pressing member,
      a supporting member configured to support the laminate, and
      a fixing mechanism configured to fix the supporting member to the base member,
   wherein the fixing mechanism includes
      a fixing member including a head and a shaft, and
      a hole formed in the supporting member and through which the shaft is insertable, and
   wherein the supporting includes fixing the supporting member to the base member by the fixing mechanism.

2. A method for producing a bonded body, including a first substrate, a second substrate, and a sealing layer bonding the first substrate and the second substrate, the method comprising:
   laminating to form a laminate by overlapping the first substrate and the second substrate while interposing a sealing material between the first substrate and the second substrate; and
   bonding to form the sealing layer by irradiating the sealing material in the laminate with a laser beam,
   wherein the bonding includes supporting to mount the laminate on a support device, pressing the laminate, and performing laser irradiation to irradiate the sealing material with the laser beam,
   wherein the support device includes
      a pressing member configured to press the laminate,
      a base member supporting the pressing member,
      a supporting member configured to support the laminate, and
      a fixing mechanism configured to fix the supporting member to the base member,
   wherein the fixing mechanism includes
      a fixing member including a head and a shaft,
      a hole formed in the supporting member and through which the head and the shaft are insertable,
      a recessed portion formed in the supporting member and configured to lock the head, and
      a guide groove formed in the supporting member and through which the shaft is relatively moved between the hole and the recessed portion, and
   wherein the supporting includes fixing the supporting member to the base member by the fixing mechanism.

3. The method for producing the bonded body according to claim 1,
   wherein the shaft of the fixing member includes a male screw portion, and
   wherein the base member includes a screw hole engaging the male screw portion.

4. The method for producing the bonded body according to claim 1,
   wherein the base member includes an elastic member supporting the supporting member, and
   wherein during the supporting, the fixing member fixes the supporting member to the base member with the elastic member being elastically deformed.

5. The method for producing the bonded body according to claim 1,
   wherein the supporting member includes a housing portion configured to house the laminate.

6. A device for producing a bonded body, the bonded body including a first substrate, a second substrate, and a sealing layer bonding the first substrate and the second substrate, the device comprising:
   a support device configured to support a laminate formed by overlapping the first substrate and the second substrate while interposing a sealing material between the first substrate and the second substrate; and
   a laser irradiation device configured to irradiate the sealing material of the laminate with a laser beam to form the sealing layer,
   wherein the support device includes
      a pressing member configured to press the laminate,
      a base member supporting the pressing member, a supporting member configured to support the laminate, and a fixing mechanism configured to fix the supporting member to the base member, wherein the fixing mechanism includes a fixing member including a head and a shaft, and a hole formed in the supporting member and through which the shaft is insertable, and wherein the supporting member is fixed to the base member by the fixing mechanism.

7. A device for producing a bonded body, the bonded body including a first substrate, a second substrate, and a sealing layer bonding the first substrate and the second substrate, the device comprising:

a support device configured to support a laminate formed by overlapping the first substrate and the second substrate while interposing a sealing material between the first substrate and the second substrate; and a laser irradiation device configured to irradiate the sealing material of the laminate with a laser beam to form the sealing layer, wherein the support device includes a pressing member configured to press the laminate, a base member supporting the pressing member, a supporting member configured to support the laminate, and a fixing mechanism configured to fix the supporting member to the base member, wherein the fixing mechanism includes a fixing member including a head and a shaft, a hole formed in the supporting member and through which the head and the shaft are insertable, a recessed portion formed in the supporting member and configured to lock the head, and a guide groove formed in the supporting member and through which the shaft is relatively moved between the hole and the recessed portion, and wherein the supporting member is fixed to the base member by the fixing mechanism.

8. The method for producing the bonded body according to claim 2, wherein the shaft of the fixing member includes a male screw portion, and wherein the base member includes a screw hole engaging the male screw portion.

9. The method for producing the bonded body according to claim 2, wherein the base member includes an elastic member supporting the supporting member, and wherein during the supporting, the fixing member fixes the supporting member to the base member with the elastic member being elastically deformed.

10. The method for producing the bonded body according to claim 2, wherein the supporting member includes a housing portion configured to house the laminate.

11. The device for producing the bonded body according to claim 6, wherein the shaft of the fixing member includes a male screw portion, and wherein the base member includes a screw hole engaging the male screw portion.

12. The device for producing the bonded body according to claim 7, wherein the shaft of the fixing member includes a male screw portion, and wherein the base member includes a screw hole engaging the male screw portion.

* * * * *